(12) United States Patent
Jin et al.

(10) Patent No.: US 12,080,596 B2
(45) Date of Patent: Sep. 3, 2024

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Abraham Yoo, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 287 days.

(21) Appl. No.: 17/223,253

(22) Filed: Apr. 6, 2021

(65) Prior Publication Data

US 2021/0384072 A1    Dec. 9, 2021

(30) Foreign Application Priority Data

Jun. 7, 2020   (CN) .......................... 202010509211.3

(51) Int. Cl.
*H01L 21/768*   (2006.01)
*H01L 21/48*   (2006.01)
*H01L 23/522*   (2006.01)

(52) U.S. Cl.
CPC ...... *H01L 21/76877* (2013.01); *H01L 21/486* (2013.01); *H01L 21/76802* (2013.01); *H01L 23/5226* (2013.01)

(58) Field of Classification Search
CPC ............ H01L 21/76877; H01L 21/486; H01L 21/76802; H01L 21/76816;
(Continued)

(56) References Cited

U.S. PATENT DOCUMENTS 9,064,801 B1 *   6/2015   Horak ............... H01L 21/76834
9,484,258 B1 *   11/2016   Kim ................... H01L 21/76811
(Continued)

*Primary Examiner* — Alia Sabur
(74) *Attorney, Agent, or Firm* — Crowell & Moring LLP

(57) ABSTRACT

A semiconductor structure and a forming method thereof are provided, and the forming method includes: providing a base; forming, on the base, a plurality of conductive function layers extending in a first direction and sequentially arranged in a second direction, a bottom dielectric layer located on the base between the conductive function layers, and a blocking structure located in the conductive function layer, the blocking structure segmenting the conductive function layers located on two sides of the blocking structure in the first direction; forming a top dielectric layer covering the bottom dielectric layer, the conductive function layers, and the blocking structure; etching the top dielectric layer located above a junction of the blocking structure and the conductive function layer and a part of the blocking structure located at a side wall of the conductive function layer, to form a via running through the top dielectric layer and exposing a part of a top and a part of a side wall of the conductive function layer; and filling the via with a via interconnection structure, the via interconnection structure being in contact with the part of the top and the part of the side wall of the conductive function layer. Therefore, embodiments of the present disclosure are helpful to improve the performance of the semiconductor structure.

12 Claims, 8 Drawing Sheets

(58) Field of Classification Search
CPC ....... H01L 21/76897; H01L 21/823431; H01L 21/823475; H01L 23/5226; H01L 23/528; H01L 27/0886; H01L 2221/101; H01L 2221/1068

See application file for complete search history.

(56) References Cited

U.S. PATENT DOCUMENTS

| | | | | |
|---|---|---|---|---|
| 11,139,242 B2* | 10/2021 | Xie | ............... | H01L 21/31053 |
| 11,462,469 B2* | 10/2022 | Lin | ............... | H01L 23/53295 |
| 2002/0113315 A1* | 8/2002 | Chung | ............. | H01L 21/76897 |
| | | | | 257/E21.507 |
| 2003/0205815 A1* | 11/2003 | Chung | ............. | H01L 21/76802 |
| | | | | 257/E21.589 |
| 2007/0298564 A1* | 12/2007 | Brar | ............... | H01L 27/0629 |
| | | | | 257/E29.338 |
| 2012/0313153 A1* | 12/2012 | Zhang | ............... | H01L 29/495 |
| | | | | 438/678 |
| 2014/0117558 A1* | 5/2014 | Boyanov | ............. | H01L 23/5226 |
| | | | | 438/618 |
| 2014/0151893 A1* | 6/2014 | Boyanov | ........... | H01L 21/76883 |
| | | | | 257/774 |
| 2014/0264873 A1* | 9/2014 | Ting | ................. | H01L 21/76801 |
| | | | | 438/653 |
| 2014/0264902 A1* | 9/2014 | Ting | ................. | H01L 21/76843 |
| | | | | 438/618 |
| 2017/0125340 A1* | 5/2017 | Tsai | ................. | H01L 21/02178 |
| 2017/0186682 A1* | 6/2017 | Anderson | ......... | H01L 21/31053 |
| 2019/0221523 A1* | 7/2019 | Singh | ................. | H01L 23/5226 |
| 2019/0311984 A1* | 10/2019 | Lin | ................... | H01L 21/76816 |
| 2019/0371657 A1* | 12/2019 | Chandhok | ......... | H01L 21/76856 |
| 2020/0006083 A1* | 1/2020 | Huang | ............. | H01L 21/76897 |
| 2020/0083106 A1* | 3/2020 | Cheng | ............ | H01L 21/823418 |
| 2020/0098629 A1* | 3/2020 | Lin | ................... | H01L 21/76816 |
| 2020/0343132 A1* | 10/2020 | Jisong | ................ | H01L 21/7682 |
| 2020/0343186 A1* | 10/2020 | Xie | ................... | H01L 21/31116 |
| 2021/0287988 A1* | 9/2021 | Xie | ................... | H01L 21/76852 |
| 2021/0384072 A1* | 12/2021 | Jin | ................... | H01L 21/76802 |

\* cited by examiner

SEMICONDUCTOR STRUCTURE AND FORMING METHOD THEREOF

RELATED APPLICATIONS

The present application claims priority to Chinese Patent Appln. No. 202010509211.3, filed Jun. 7, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the development of manufacturing of integrated circuits toward ultra-large-scale integrated circuits (ULSIs), a circuit density inside an integrated circuit is increasingly high and a quantity of contained elements is increasing. As a result, there is insufficient area on a chip surface for manufacturing required interconnection lines. To adapt to interconnection line requirements resulting from a scale down of the elements, a design of multilayer metal interconnection structure including two or more layers that is implemented using interconnection trenches and vias has become a necessary method in the ULSI technology.

In the back end of line process of semiconductor devices, a metal interconnection structure formation process generally needs to be performed. The metal interconnection structure formation process is generally performed on a semiconductor substrate, the semiconductor substrate is generally provided with an active area, and semiconductor devices such as transistors and capacitors are formed on the active area. There may be a plurality of layers of conductive plugs and metal interconnection lines in the metal interconnection structure, and the plurality of layers of metal interconnection lines may be electrically connected through the conductive plugs. When a next layer of metal interconnection line is formed on a previous layer of conductive plug or a next layer of conductive plug is formed on a previous layer of metal interconnection line, an interlayer dielectric layer is generally formed on the previous layer of metal plug or metal interconnection line, a via and an interconnection trench are then formed in the interlayer dielectric layer, and finally, the next layer of conductive plug or interconnection line is formed by using metal to fill the via and the interconnection trench.

SUMMARY

A problem addressed by embodiments and implementations of the present disclosure is to provide a semiconductor structure and a forming method thereof, which are helpful to improve the performance of the semiconductor structure.

To address the foregoing problem, one form of the present disclosure provides a forming method of a semiconductor structure, including: providing a base; forming, on the base, a plurality of conductive function layers extending in a first direction and sequentially arranged in a second direction, a bottom dielectric layer located on the base between the conductive function layers, and a blocking structure located in the conductive function layers, the blocking structure segmenting the conductive function layers located on two sides of the blocking structure in the first direction; forming a top dielectric layer covering the bottom dielectric layer, the conductive function layers, and the blocking structure; etching the top dielectric layer located above a junction of the blocking structure and the conductive function layer and a part of the blocking structure located at a side wall of the conductive function layer to form a via running through the top dielectric layer and exposing a part of a top and a part of a side wall of the conductive function layer; and filling the via with a via interconnection structure, the via interconnection structure being in contact with the part of the top and the part of the side wall of the conductive function layer.

Another form of the present disclosure further provides a semiconductor structure, including: a base; a plurality of conductive function layers extending in a first direction and sequentially arranged in a second direction that are located on the base; a bottom dielectric layer, located on the base between the conductive function layers; a blocking structure located in the conductive function layer, the blocking structure segmenting the conductive function layers located on two sides of the blocking structure in the first direction; a top dielectric layer, covering the bottom dielectric layer, the conductive function layers, and the blocking structure; and a via interconnection structure, including a first part that is located in a part of a width of the blocking structure at a side wall of the conductive function layer and in contact with a part of a side wall of the conductive function layer, and a second part connected to the first part and located on the first part, the second part running through the top dielectric layer located above a junction of the blocking structure and the conductive function layer and being in contact with a part of a top of the conductive function layer.

Compared with the prior art, technical solutions of embodiments and implementations of the present disclosure have the following advantages.

In forms of a forming method of a semiconductor structure provided in the present disclosure, a via interconnection structure is in contact with a part of a top of a conductive function layer, and the via interconnection structure can be partially located on an end portion of the conductive function layer close to a blocking structure, which is helpful to improve a degree of freedom of a layout design of the via interconnection structure. Moreover, in a step of forming the via in, a top dielectric layer located above a junction of the blocking structure and the conductive function layer and a part of the blocking structure located at the side wall of the conductive function layer are etched, so that the via further exposes a part of the side wall of the conductive function layer. Accordingly, in a process of forming the via interconnection structure, the via interconnection structure is not only in contact with the part of the top of the conductive function layer, but also in contact with the part of the side wall of the conductive function layer. That is, the via interconnection structure covers a top corner of the conductive function layer adjacent to the blocking structure, which is helpful to increase a contact area between the via interconnection structure and the conductive function layer, so as to help to reduce the contact resistance between the via interconnection structure and the conductive function layer, to further help to improve the performance of the semiconductor structure.

DETAILED DESCRIPTION

Currently semiconductor devices have a problem of poor interconnection performance. Reasons for the poor interconnection performance of the devices are analyzed now in combination with a semiconductor structure.

Figure 1:
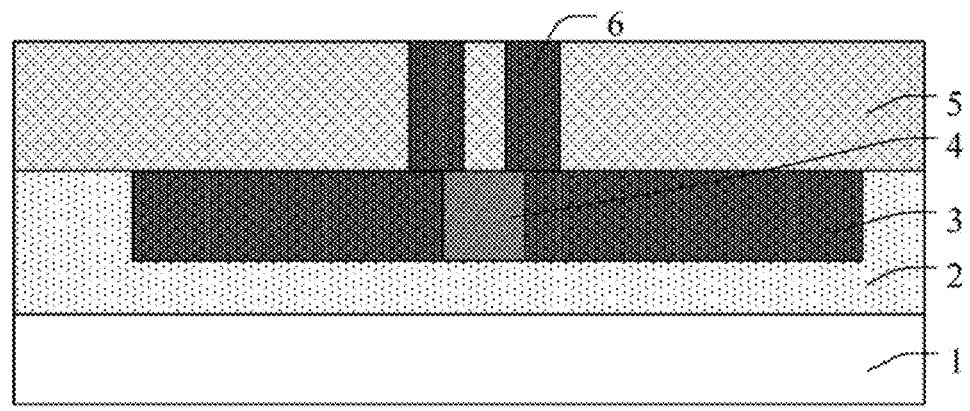
FIG. 1 is a schematic structural diagram of a semiconductor structure.

FIG. 1 is a schematic structural diagram of a semiconductor structure.

The semiconductor structure includes: a base 1; a bottom dielectric layer 2, located on the base 1; a plurality of interconnection lines 3 extending in a first direction and sequentially arranged in a second direction, and located in the bottom dielectric layer 2; a blocking structure 4 located in the interconnection line 3, the blocking structure 4 segmenting the interconnection lines 3 located on two sides of the blocking structure 4 in the first direction; a top dielectric layer 5, covering the interconnection lines 3, the blocking structure 4, and the bottom dielectric layer 2; and a via interconnection structure 6, running through the top dielectric layer 5 located above a junction of the blocking structure 4 and the interconnection line 3, and in contact with a part of a top of the interconnection line 3.

In the semiconductor structure, a partial via landing process of the via interconnection structure 6 and the interconnection line 3 is adopted, and the via interconnection structure 6 is located in the top dielectric layer 5 and covers the junction of the blocking structure 4 and the interconnection line 3. That is, only a part of a bottom of the via interconnection structure 6 is in contact with the interconnection line 3, and the via interconnection structure 6 can be directly landed on an end portion of the interconnection line 3 close to the blocking structure 4, which is helpful to improve a degree of freedom of a layout design of the via interconnection structure 6, and accordingly improve the friendliness to back-end wire wrapping.

However, in the semiconductor structure, only the part of the bottom of the via interconnection structure 6 is in contact with the interconnection line 3, and a contact area between the via interconnection structure 6 and the interconnection line 3 is relatively small, which easily leads to a problem that the contact resistance between the via interconnection structure 6 and the interconnection line 3 is relatively large, further leading to poor interconnection performance between devices.

To address technical problems such as those described above, in implementations of the forming method of a semiconductor structure provided in the present disclosure, the via interconnection structure is in contact with the part of the top of the conductive function layer, and the via interconnection structure can be partially located on an end portion of the conductive function layer close to the blocking structure, which is helpful to improve a degree of freedom of a layout design of the via interconnection structure. Moreover, in the step of forming the via in some implementations, the top dielectric layer located above the junction of the blocking structure and the conductive function layer and a part of the blocking structure located at the side wall of the conductive function layer are etched, so that the via further exposes the part of the side wall of the conductive function layer. Accordingly, in implementations of a process of forming the via interconnection structure, the via interconnection structure is not only in contact with the part of the top of the conductive function layer, but also in contact with the part of the side wall of the conductive function layer. That is, the via interconnection structure covers a top corner of the conductive function layer adjacent to the blocking structure, which is helpful to increase a contact area between the via interconnection structure and the conductive function layer, so as to help to reduce the contact resistance between the via interconnection structure and the conductive function layer, to further help to improve the performance of the semiconductor structure.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 2 to FIG. 19 are schematic structural diagrams corresponding to steps in one form of a forming method of a semiconductor structure according to the present disclosure.

Figure 2:
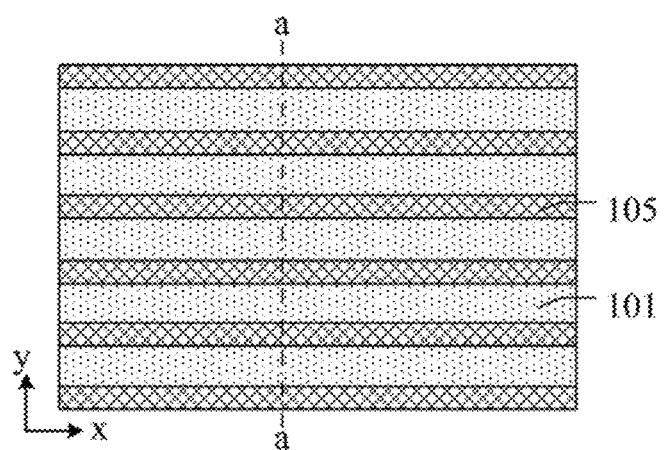
FIG. 2 to FIG. 19 are schematic structural diagrams corresponding to steps in one form of a forming method of a semiconductor structure according to the present disclosure.

Referring to FIG. 2, a base 100 is provided. The base 100 is configured to provide a process platform for subsequent processes.

In some implementations, semiconductor devices such as a transistor and a capacitor may be formed in the base 100, and functional structures such as a resistance structure and a conductive structure may also be formed in the base 100.

Figure 10:
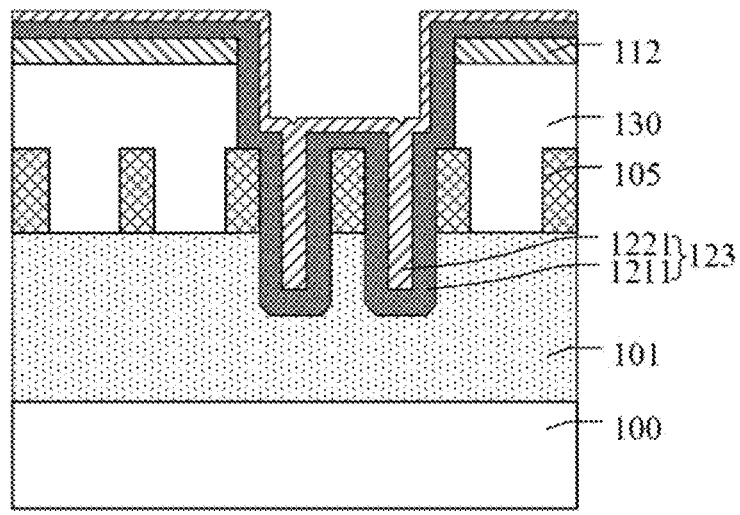
Figure 11:
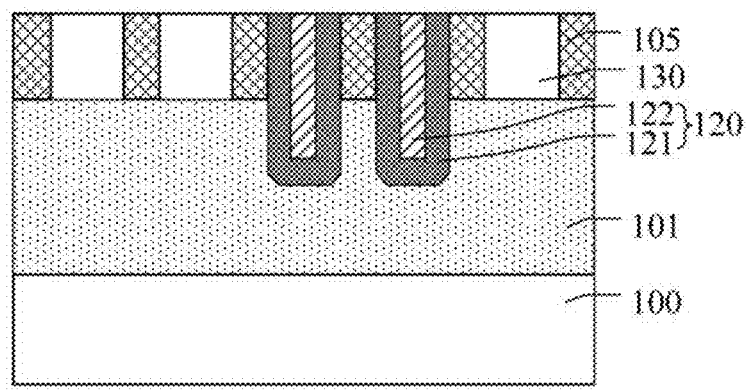
Figure 13:
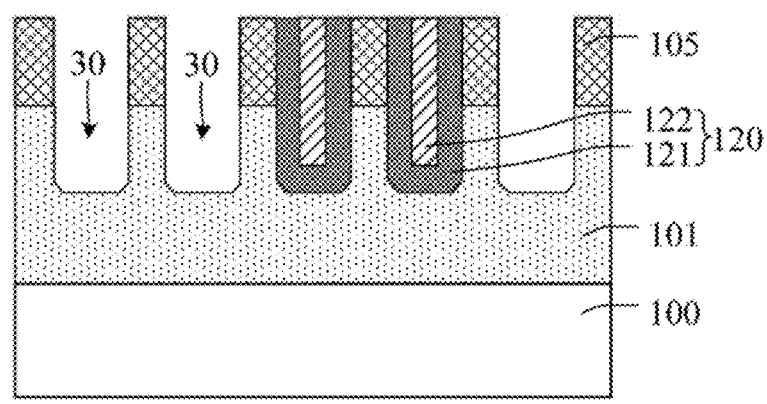
Figure 14:
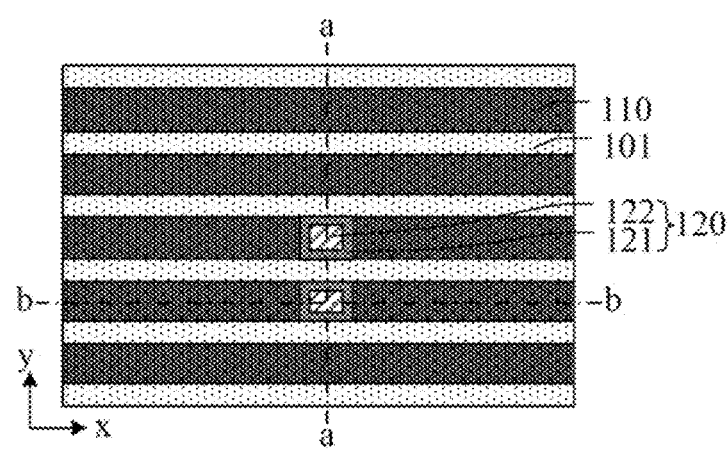

With reference to FIG. 2 to FIG. 16, a plurality of conductive function layers 110 (as shown in FIG. 14) extending in a first direction (as an x direction shown in FIG. 2) and sequentially arranged in a second direction (as a y direction shown in FIG. 2) that are located in a bottom dielectric layer 101, the bottom dielectric layer 101 (as shown in FIG. 14) located on the base 100 between the conductive function layers 110, and a blocking structure 120 (as shown in FIG. 11) located in the conductive function layer 110 are formed on the base 100. The blocking structure 120 segments the conductive function layers 110 located on two sides of the blocking structure 120 in the first direction. In some implementations, the second direction is perpendicular to the first direction.

The bottom dielectric layer 101 is configured to implement the electrical isolation between the conductive function layers 110.

In some implementations, the bottom dielectric layer 101 is an inter metal dielectric (IMD) layer, and the bottom dielectric layer 101 is configured to implement the electrical isolation between adjacent interconnection structures in a back end of line (BEOL) process. Therefore, a material of the bottom dielectric layer 101 is a low-k dielectric material (the low-k dielectric material refers to a dielectric material having a relative dielectric constant greater than or equal to 2.6 and less than or equal to 3.9), an ultra-low-k dielectric material (the ultra-low-k dielectric material refers to a dielectric material having a relative dielectric constant less than 2.6), silicon oxide, silicon nitride, silicon oxynitride or the like.

The bottom dielectric layer 101 is a single-layer structure or a multi-layer structure. As an example, the bottom dielectric layer 101 is a single-layer structure, and the material of the bottom dielectric layer 101 is an ultra-low-k dielectric material, thereby reducing a parasitic capacitance between the interconnection structures in the BEOL, and further reducing RC delay in the BEOL. Specifically, the ultra-low-k dielectric material may be SiOCH.

In some implementations, the bottom dielectric layer 101 is further formed between the conductive function layer 110 and the base 100 and between the blocking structure 120 and the base 100.

In some implementations, the bottom dielectric layer 101 exposes top surfaces of the conductive function layer 110 and the blocking structure 120. The bottom dielectric layer 101 exposes the top surface of the conductive function layer 110, to subsequently form other interconnection structures electrically connected to the conductive function layer 110.

Accordingly, in some implementations, the conductive function layer 110 is an interconnection line 110, and the bottom dielectric layer 101 is configured to implement the electrical isolation between adjacent interconnection lines 110.

The interconnection line 110 is configured to implement the electrical connection between the base 100 and an external circuit or other interconnection structures. As an example, the interconnection line 110 is a single-layer structure, and a material of the interconnection line 110 is copper. A resistivity of the copper is relatively low, which is helpful to reduce signal delay of RC in the BEOL and improve a processing speed of a chip, and is also helpful to reduce the resistance of the interconnection line and power consumption accordingly. In other implementations, the material of the interconnection line may alternatively be a conductive material such as cobalt, tungsten, or aluminum, and the interconnection line may alternatively be a multi-layer structure.

In some implementations, a case that the bottom dielectric layer 101 and the interconnection line 110 are formed on the base 100 is used as an example. In an actual process, one or more dielectric layers may be formed between the bottom dielectric layer 101 and the base 100, and an interconnection line or a conductive plug may be formed in each dielectric layer.

The blocking structure 120 is configured to segment the conductive function layers 110 in the first direction, so as to disconnect the conductive function layers 110 at a position where interconnection is not required, so that a pattern of the conductive function layers 110 meets a design requirement.

Moreover, subsequent steps further include: forming a top dielectric layer covering the blocking structure 120, the conductive function layers 110, and the bottom dielectric layer 101; etching the top dielectric layer located above a junction of the blocking structure 120 and the conductive function layer 110 and a part of the blocking structure 120 located at a side wall of the conductive function layer 110, to form a via running through the top dielectric layer and exposing a part of a top and a part of a side wall of the conductive function layer 110; and filling the via with a via interconnection structure, the via interconnection structure being in contact with the part of the top and the part of the side wall of the conductive function layer 110.

In some implementations, the blocking structure 120 includes an etch stop layer 122 and a pad layer 121 located between the etch stop layer 122 and the side wall of the conductive function layer 110, and the pad layer 121 is further formed on a bottom of the etch stop layer 122.

The blocking structure 120 includes the etch stop layer 122 and the pad layer 121, so that in a subsequent process of forming a via, the pad layer 121 located on the side wall of the conductive function layer 110 may be etched. The etch stop layer 122 may define an etch stop position in the process of forming a via. A process of etching the top dielectric layer has a relatively high etching selection ratio of the top dielectric layer to the etch stop layer 122, a process of etching the pad layer 121 has a relatively high etching selection ratio of the pad layer 121 to the etch stop layer 122, and a process of etching the top dielectric layer and the pad layer 121 has a low probability of mistakenly etching the etch stop layer 122, which is helpful to reduce a probability that a via located on one side of the blocking structure 120 exposes the conductive function layer 110 located on the other side of the blocking structure 120. Accordingly, a probability that there is a short circuit problem between the via interconnection structure and the adjacent conductive function layer 110 is relatively low, so that the via interconnection structure subsequently can be partially landed on an end portion of the conductive function layer 110 close to the blocking structure 120, to further help to improve the degree of freedom of a layout design of forming the via interconnection structure and enlarge a process window of forming the via interconnection structure.

A material of the pad layer 121 includes at least one of silicon oxide, silicon nitride, aluminum oxide, titanium oxide, nitrogen doped silicon carbide, carbon doped silicon oxide, or silicon carbide. The material of the pad layer 121 is a dielectric material, which is helpful to reduce the impact on the performance of the semiconductor structure, and also ensures that the blocking structure 120 can electrically isolate the conductive function layers 110 located on two sides of the blocking structure 120 in the first direction.

In some implementations, the material of the pad layer 121 is silicon oxide. The silicon oxide is a common dielectric material that is easily obtained in a semiconductor process, which is helpful to improve process compatibility and reduce process costs, and a dielectric constant of silicon oxide is relatively low, which is helpful to reduce the parasitic capacitance between the conductive function layers 110, and improve TDDB characteristics accordingly.

A material of the etch stop layer 122 includes at least one of silicon oxide, silicon nitride, aluminum oxide, titanium oxide, nitrogen doped silicon carbide, carbon doped silicon oxide, or silicon carbide. The material of the etch stop layer 122 is different from the material of the pad layer 121. In some implementations, the material of the etch stop layer 122 is aluminum oxide. In a subsequent etching process of forming a via, the etching process has a relatively large etching selection ratio of the material of the top dielectric layer to aluminum oxide and a relatively large etching selection ratio of silicon oxide to aluminum oxide, so as to ensure that the etch stop layer 122 can play a role of defining the etch stop position.

In some implementations, a case that the blocking structure 120 includes the etch stop layer 122 and the pad layer 121 located between the etch stop layer 122 and the side wall of the conductive function layer 110, and the pad layer 121 is further formed on a bottom of the etch stop layer 122 is used as an example.

In other implementations, the blocking structure may alternatively include the etch stop layer and a pad layer located between the etch stop layer and the side wall of the conductive function layer. In some implementations, the pad layer is only located between the etch stop layer and the side wall of the conductive function layer. That is, the thickness of the etch stop layer is larger, which is helpful to improve the effect of the etch stop layer configured to define the etch stop position of the etching process of forming a via and helpful to further enlarge the process window of forming a via interconnection structure accordingly.

In some implementations, a case that the blocking structure 120 is a multi-layer structure is used as an example. In other implementations, the blocking structure may alternatively be a single-layer structure.

Detailed description is made below on the step of forming the interconnection line 110, the bottom dielectric layer 101, and the blocking structure 120 in the present embodiment with reference to the accompanying drawings.

Figure 3:
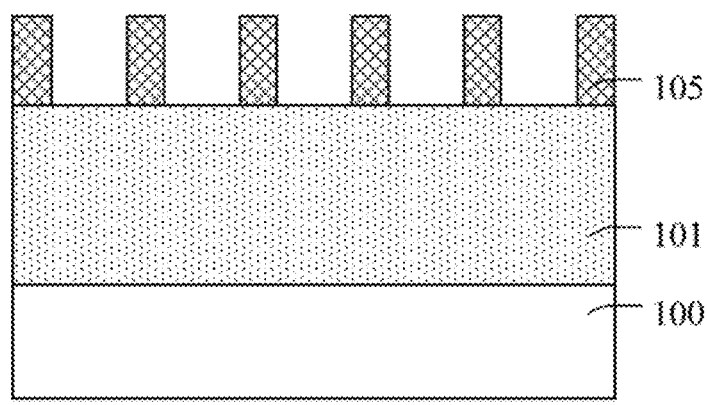

Referring to FIG. 2 and FIG. 3, FIG. 2 is a top view, FIG. 3 is a cross-sectional view along a cutting line a-a in FIG. 2, and the bottom dielectric layer 101 is formed on the base 100. In some implementations, the bottom dielectric layer 101 is formed using a deposition process. Specifically, the deposition process includes a chemical vapor deposition process, a plasma enhanced deposition process, or the like.

Still referring to FIG. 2 and FIG. 3, a plurality of hard mask layers 105 extending in a first direction and sequentially arranged in a second direction are formed on the bottom dielectric layer 101.

The hard mask layer 105 is used as a mask for subsequently etching the bottom dielectric layer 101 to form an interconnection trench. The interconnection trench is configured to provide space for forming interconnection lines. In some implementations, the bottom dielectric layer 101 is an IMD layer. Accordingly, the hard mask layer is a metal hard mask layer.

In some implementations, the material of the hard mask layer 105 is silicon nitride. In other implementations, the material of the hard mask layer may alternatively include materials such as silicon oxide, silicon oxynitride, silicon carbide, titanium, titanium oxide, titanium nitride, tantalum, tantalum oxide, tantalum nitride, boron nitride, copper nitride, aluminum nitride, and tungsten nitride.

The hard mask layer 105 may be formed through a patterning process such as a self-aligned double patterning (SADP) process or a self-aligned quadruple patterning (SAQP) process.

Figure 6:
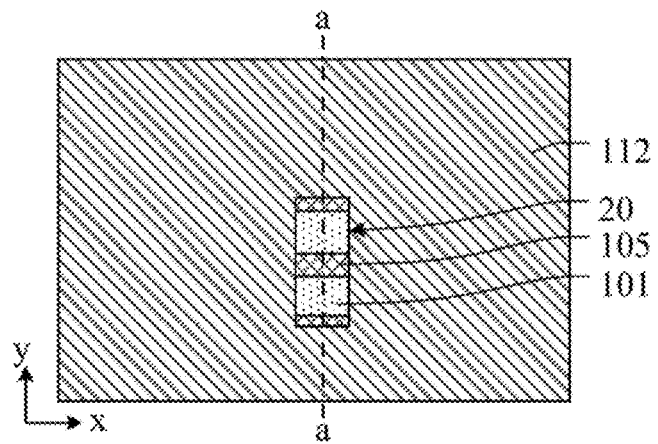
Figure 7:
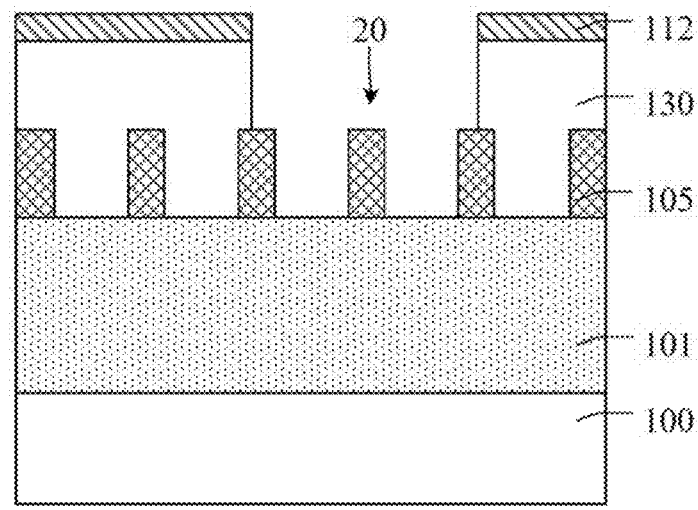
Figure 8:
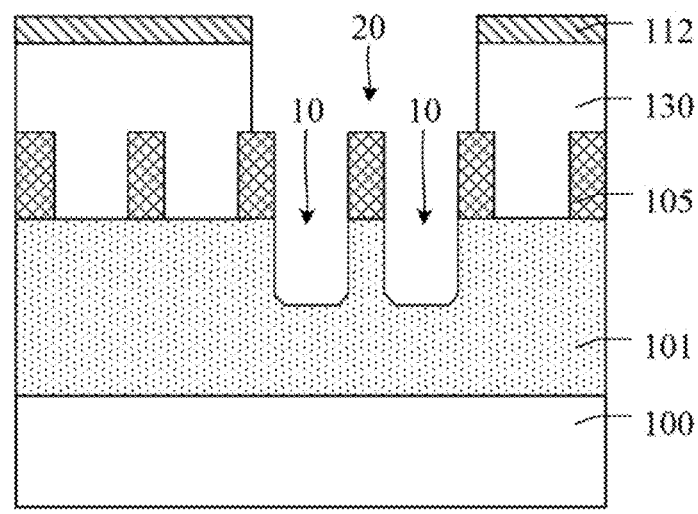

Referring to FIG. 4 to FIG. 8, a part of the bottom dielectric layer 101 located between the adjacent hard mask layers 105 is etched in the second direction, to form a blocking groove 10 (as shown in FIG. 8) encircled by the hard mask layers 105 and the bottom dielectric layer 101. The blocking groove 10 is configured to provide a space for forming a blocking structure.

Figure 4:
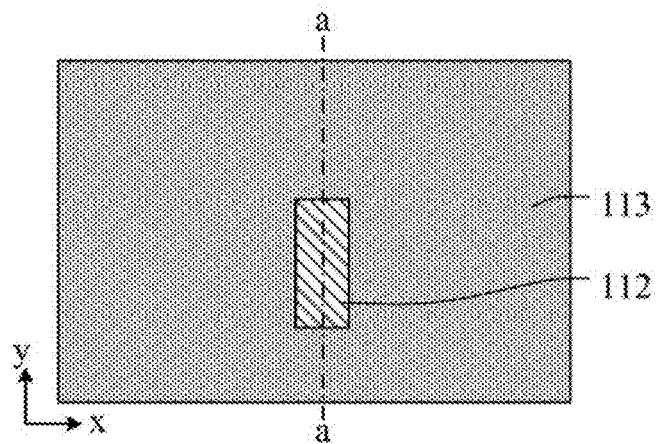
Figure 5:
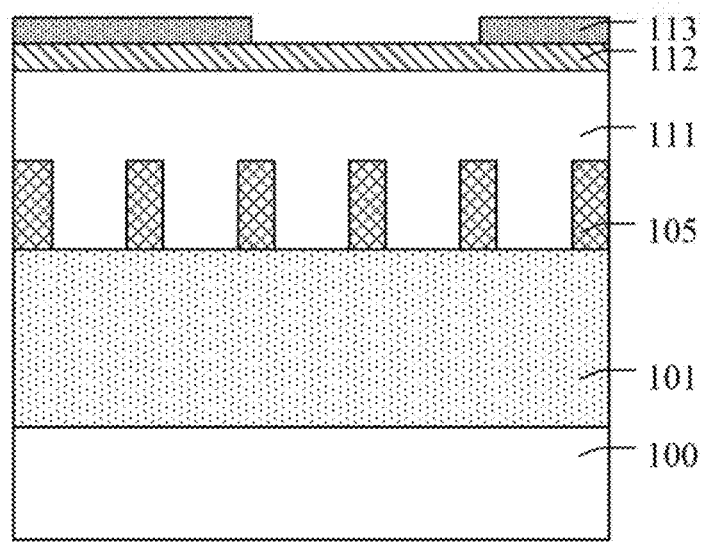

In some implementations, the step of forming a blocking groove 10 includes: as shown in FIG. 4 to FIG. 7, FIG. 4 and FIG. 6 are top views, and FIG. 5 and FIG. 7 are respectively cross-sectional views along the cutting line a-a in FIG. 4 and FIG. 6, forming a pattern layer 130 covering the hard mask layer 105 on the bottom dielectric layer 101, a mask opening 20 exposing a part of a top surface of the bottom dielectric layer 101 located between the adjacent hard mask layers 105 and a part of a side wall of the hard mask layer 105 in the second direction being formed in the pattern layer 130; and as shown in FIG. 8, etching a part of a thickness of the bottom dielectric layer 101 exposed by the mask opening 20 using the pattern layer 130 as a mask, to form the blocking groove 10.

The pattern layer 130 is used as a mask for etching the bottom dielectric layer 101 to form the blocking groove 10. Therefore, a pattern and a location of the pattern layer 130 define a pattern and a location of the blocking groove 10. In some implementations, a material of the pattern layer 130 includes spin-on carbon (SOC), the SOC has relatively good filling performance, and the SOC may be formed through a spin coating process, which is helpful to reduce the difficulty and process costs of forming the pattern layer 130. In other implementations, the material of the pattern layer may alternatively be another suitable material.

In some implementations, the step of forming a pattern layer 130 includes: as shown in FIG. 4 and FIG. 5, forming a filling layer 111 covering the hard mask layer 105 on the bottom dielectric layer 101; forming an anti-reflective coating 112 on the filling layer 111; forming a photoresist layer 113 on the anti-reflective coating 112; and as shown in FIG. 6 and FIG. 7, etching the anti-reflective coating 112 and the filling layer 111 sequentially by using the photoresist layer 113 as a mask, to form the mask opening 20, the remaining filling layer 111 being used as the pattern layer 130.

The filling layer 111 is configured to form the pattern layer 130, and the filling layer 111 is further configured to provide a flat surface for forming the anti-reflective coating 112 and the photoresist layer 113.

In some implementations, the anti-reflective coating 112 is configured to reduce a reflection effect during exposure, thereby improving pattern transfer precision. In some implementations, the anti-reflective coating 112 is a Si-ARC layer, and the Si-ARC layer helps to increase the exposure depth of field (DOF) during the photolithography process, thereby helping to improve exposure uniformity. Moreover, the Si-ARC layer is rich in silicon, and therefore further helps to increase the hardness of the anti-reflective coating 112, thereby helping to further improving the pattern transfer precision. In other implementations, the anti-reflective coating may alternatively be another suitable anti-reflective material, for example, a bottom anti-reflective coating (BARC).

The photoresist layer 113 is used as a mask for etching the filling layer 111 to form the mask opening 20. A material of the photoresist layer 113 is a photoresist. The photoresist layer 113 may be formed through photolithography processes such as photoresist coating, exposure, and development. In some implementations, the anti-reflective coating 112 and the filling layer 111 are sequentially etched by using the photoresist layer 113 as a mask through an anisotropic dry etching process.

In some implementations, the part of the thickness of the bottom dielectric layer 101 exposed by the mask opening 20 is etched by using the pattern layer 130 as a mask through the anisotropic dry etching process, to form the blocking groove 10. The anisotropic dry etching process has the characteristic of anisotropic etching, which is helpful to improve the pattern transfer precision and make the pattern of the blocking groove 10 meet a design requirement.

In some implementations, in the step of etching a part of a thickness of the bottom dielectric layer 101 exposed by the mask opening 20 using the pattern layer 130 as a mask, the photoresist layer 113 is gradually consumed. Therefore, after the blocking groove 10 is formed, the photoresist layer 113 has been removed.

Figure 9:
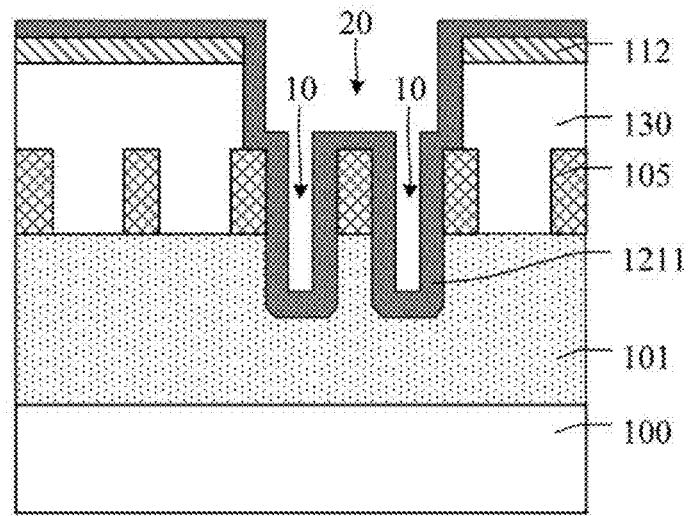

Referring to FIG. 9 to FIG. 11, a blocking structure 120 filled in the blocking groove 10 is formed.

The blocking structure 120 is configured to be used together with the hard mask layer 105 as masks for subsequently etching the bottom dielectric layer 101 to form an interconnection trench. The blocking structure 120 located in the bottom dielectric layer 101 is further configured to segment the interconnection lines located on two sides of the blocking structure 120 in the first direction.

In some implementations, the step of forming a blocking structure 120 includes: as shown in FIG. 9 and FIG. 10, forming a blocking film 123 filling the blocking groove 10, the blocking film 123 being further formed on a side wall of the mask opening 20 and a top of the pattern layer 130; and as shown in FIG. 11, removing the blocking film 123 and the pattern layer 130 that are higher than the hard mask layer 105, the remaining blocking film 123 located in the blocking groove 10 being used as the blocking structure 120.

In some implementations, the blocking structure 120 includes an etch stop layer 122 and a pad layer 121 located between the etch stop layer 122 and the side wall of the conductive function layer. Therefore, in the step of forming a blocking structure 120, the blocking structure 120 includes a pad layer 121 located on the side wall of the blocking groove 10 and an etch stop layer 122 located on the pad layer 121 and filling the blocking groove 10.

In some implementations, a case that the blocking structure 120 includes the etch stop layer 122 and the pad layer 121 is used as an example, and the step of forming a blocking structure 120 includes: as shown in FIG. 9, forming a pad film 1211 on a bottom and a side wall of the blocking groove 10, the side wall of the mask opening 20, and a top surface of the pattern layer 130; as shown in FIG. 10, forming an etch stop film 1221 located on the pad film 1211 and filled in the blocking groove 10, the etch stop film 1221 and the pad film 1211 being configured to constitute the blocking film 123; and as shown in FIG. 11, removing the etch stop film 1221, the pad film 1211, and the pattern layer 130 that are higher than the hard mask layer 105, the remaining etch stop film 1221 located in the blocking groove 10 being used as the etch stop layer 122, and the remaining pad film 1211 located in the blocking groove 10 being used as the pad layer 121.

The pad film 1211 is configured to form the pad layer 121. In some implementations, a process of forming the pad film 1211 includes an atomic layer deposition process. The atomic layer deposition process has relatively high stepped covering property, helping to ensure that the pad film 1211 can be formed on the bottom and the side wall of the blocking groove 10, the side wall of the mask opening 20, and the top surface of the pattern layer 130, and also helping to improve the thickness uniformity and thin-film deposition quality of the pad film 1211.

In some implementations, the pad film 1211 is formed on the anti-reflective coating 112 located on the pattern layer 130.

A process of forming the etch stop film 1221 includes one or two of the atomic layer deposition process and the spin coating process. In some implementations, the etch stop layer 1221 is formed using the atomic layer deposition process. The atomic layer deposition process has relatively good gap filling performance and stepped covering property, thereby improving the covering property of the etch stop film 1221 on the bottom and the side wall of the blocking groove 10. Moreover, the atomic layer deposition process includes performing a plurality of atomic layer deposition cycles to form a film layer with required thickness, helping to improve the thickness uniformity and density of the etch stop film 1221, so that the thickness of the etch stop film 1221 can be precisely controlled, and an effect of the etch stop film 1221 being configured to define an etch stop position is also improved. In the process of forming the etch stop film 1221, the etch stop films 1221 located on the pad films 1211 on side walls of the blocking groove 10 are gradually in contact with each other as the thickness of the deposition material gradually increases, to fill the etch stop films 1221 in the blocking groove 10.

In other implementations, the process of forming the etch stop film alternatively includes the spin coating process according to an actual process. The spin coating process is simple in operation and helpful to improve the filling capability of the etch stop film in the blocking groove.

In some implementations, a case that after the pad film 1211 is formed, the etch stop film 1221 is then formed is used as an example. In other implementations, the step of forming a blocking structure further includes: after forming the pad film and before forming the etch stop film, removing the pad film located on the bottom of the blocking groove and the top surface of the pattern layer. By removing the pad film located on the bottom of the blocking groove and the top surface of the pattern layer, in the process of forming the etch stop film, the etch stop film can be in contact with the bottom of the blocking groove, helping to increase a formation depth of the etch stop layer, and helping to improve the effect of defining an etch stop position of the etch stop layer in the subsequent etching process of forming a via accordingly.

In some implementations, the etch stop film 1221, the pad film 1211, and the pattern layer 130 are etched using the top surface of the hard mask layer 105 as a stop position, helping to reduce the process difficulty of forming the blocking structure 120.

In some implementations, the etch stop film 1221, the pad film 1211, and the pattern layer 130 that are higher than the hard mask layer 105 are removed by using the dry etching process. Specifically, the dry etching process is an anisotropic dry etching process. The anisotropic dry etching process has the characteristic of anisotropic etching, which is helpful to improve the etching precision.

Figure 12:
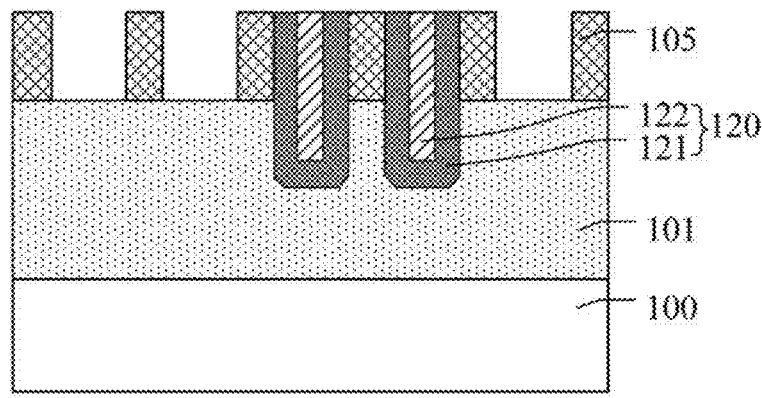

With reference to FIG. 12, in some implementations, after forming the blocking structure 120 and before forming the interconnection trench, the forming method of a semiconductor structure further includes: removing the pattern layer 130, and exposing the bottom dielectric layer 101 located between the hard mask layers 105.

The bottom dielectric layer 101 located between the hard mask layers 105 are exposed to make preparation for subsequently etching the bottom dielectric layer 101 using the hard mask layers 105 and the blocking structure 120 as masks. In some implementations, the pattern layer 130 is removed using at least one of an ashing process or a wet degumming process.

Referring to FIG. 13, a part of a thickness of the bottom dielectric layer 105 is etched using the hard mask layers 105 and the blocking structure 120 as masks, to form an interconnection trench 30 in the bottom dielectric layer 101.

The interconnection trench 30 is configured to provide a space for forming interconnection lines.

In some implementations, the blocking structure 120 is first formed, and the part of the thickness of the bottom dielectric layer 101 is then etched using the hard mask layers 105 and the blocking structure 120 as masks to form the interconnection trench 30. Accordingly, in the process of forming the interconnection trench 30, the blocking structure 120 segments the interconnection trenches 30 located on two sides of the blocking structure in the first direction, to enable the blocking structure 120 to be self-aligned with the interconnection trenches 30. Moreover, after the interconnection lines 110 are subsequently formed in the interconnection trench 30, the interconnection lines 110 located on two sides of the blocking structure 120 are segmented by the blocking structure 120 in the first direction, so that the step of etching the interconnection lines 110 is not required. The material of the interconnection line 110 is generally a metal material, and the difficulty of the etching process of the metal material is relatively large, so that it is helpful to reduce the process difficulty by omitting the step of etching the interconnection lines 110.

In some implementations, the part of the thickness of the bottom dielectric layer 105 is etched using the anisotropic dry etching process, to form the interconnection trench 30 in the bottom dielectric layer 101. By using the anisotropic dry etching process, it is helpful to improve etching profile controllability and also helpful to improve the pattern transfer precision, and helpful to make the pattern of the interconnection trench 30 meet a design requirement accordingly.

After the interconnection trench 30 is formed, the interconnection trenches 30 located on two sides of the blocking structure 120 in the first direction are isolated by the blocking structure 120.

In some implementations, a case that the bottom of the interconnection trench 30 is flush with a bottom of the blocking structure 120 is used as an example. In other implementations, the bottom of the interconnection trench may alternatively be lower than or higher than the bottom of the blocking structure. Accordingly, when the bottom of the interconnection trench is lower than the bottom of the blocking structure, the interconnection trenches located on the two sides of the blocking structure in the first direction are isolated by the blocking structure and the bottom dielectric layer on the bottom of the blocking structure.

In some implementations, the forming method of a semiconductor structure further includes: removing the hard mask layer 105 and the blocking structure 120 that is higher than the bottom dielectric layer 101.

As an example, after the interconnection trench 30 is formed and before the interconnection line is formed in the interconnection trench 30, the hard mask layer 105 and the blocking structure 120 that is higher than the bottom dielectric layer 101 are removed.

By removing the hard mask layer 105 and the blocking structure 120 that is higher than the bottom dielectric layer 101 before the interconnection line is formed in the interconnection trench 30, in a subsequent process of forming the interconnection line, the material of the interconnection line does not need to be formed between the hard mask layers 105, which is helpful to reduce the depth of the interconnection line required to be filled, so as to help to improve the filling capability and filling quality of the interconnection line in the interconnection trench 30.

In some implementations, the hard mask layer 105 and the blocking structure 120 that is higher than the bottom dielectric layer 101 are removed using one or two processes of the dry etching and the wet etching.

In other implementations, in the process of forming the interconnection line, the hard mask layer and the blocking structure that is higher than bottom dielectric layer may alternatively be removed according to an actual process. Specifically, the process of forming the interconnection line includes a step of removing a conductive layer that is higher than the bottom dielectric layer by using a planarization process (for example, a chemical mechanical polishing process), and in the process of removing the conductive layer that is higher than the bottom dielectric layer by using the planarization process, the hard mask layer and the blocking structure that is higher than the bottom dielectric layer are removed.

Figure 15:
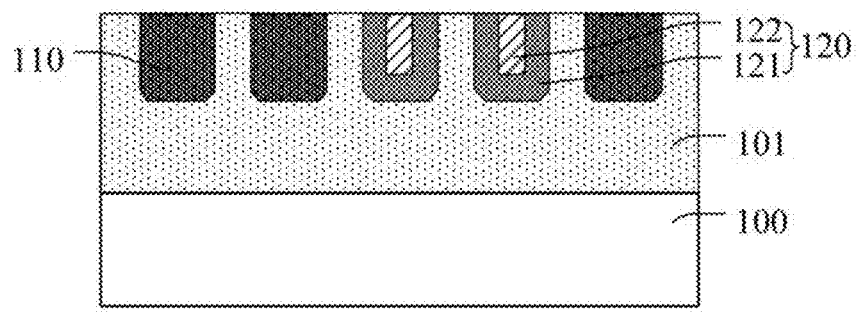
Figure 16:
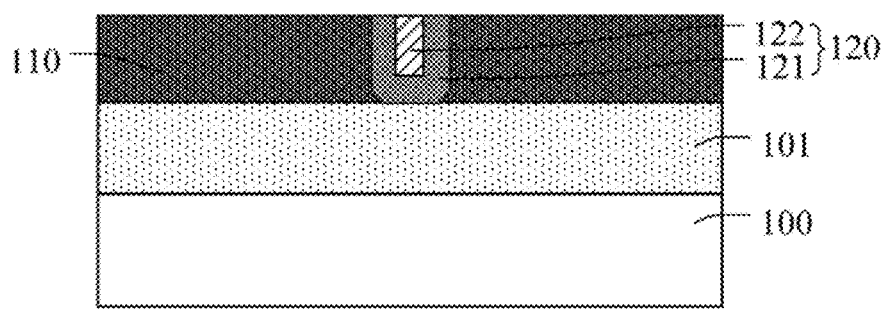

Referring to FIG. 14 and FIG. 16, FIG. 14 is a top view, FIG. 15 is a cross-sectional view along a cutting line a-a in FIG. 14, and FIG. 16 is a cross-sectional view along a cutting line b-b in FIG. 14, where the interconnection line 110 is formed in the interconnection trench 30.

In some implementations, the step of forming an interconnection line 110 includes: forming a conductive layer (not shown in the figure) filled in the interconnection trench 30, the conductive layer being further formed on the bottom dielectric layer 101 and the blocking structure 120; and removing the conductive layer that is higher than the bottom dielectric layer 101, the remaining conductive layer located in the interconnection trench 30 being used as the interconnection line 110.

It should be noted that the step of forming the bottom dielectric layer 101, the interconnection line 110, and the blocking structure 120 in the present implementation is only used as an example. However, in the present disclosure, steps of forming a bottom dielectric layer, an interconnection line, and a blocking structure are not limited thereto. In other implementations, the bottom dielectric layer, the interconnection line, and the blocking structure may alternatively be formed using another suitable process according to an actual process requirement.

Figure 17:
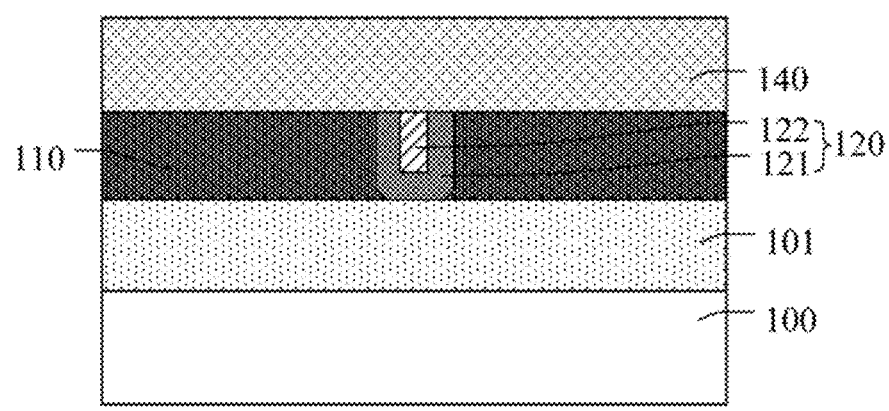

Referring to FIG. 17, the top dielectric layer 140 covering the bottom dielectric layer 101, the conductive function layer 110, and the blocking structure 120 is formed.

Subsequent steps further include: forming a via running through the top dielectric layer 140 and exposing the part of the top and the part of the side wall of the conductive function layer 110; forming a via in the top dielectric layer 140; and filling the vias with a via interconnection structure. The top dielectric layer 140 is configured to implement the electrical isolation between the via interconnection structures.

In some implementations, the top dielectric layer 140 is also an IMD layer.

In some implementations, a material of the top dielectric layer 140 is the same as the material of the bottom dielectric layer 101.

Specifically, the top dielectric layer 140 is formed by using the deposition process, for example, the chemical vapor deposition process.

Figure 18:
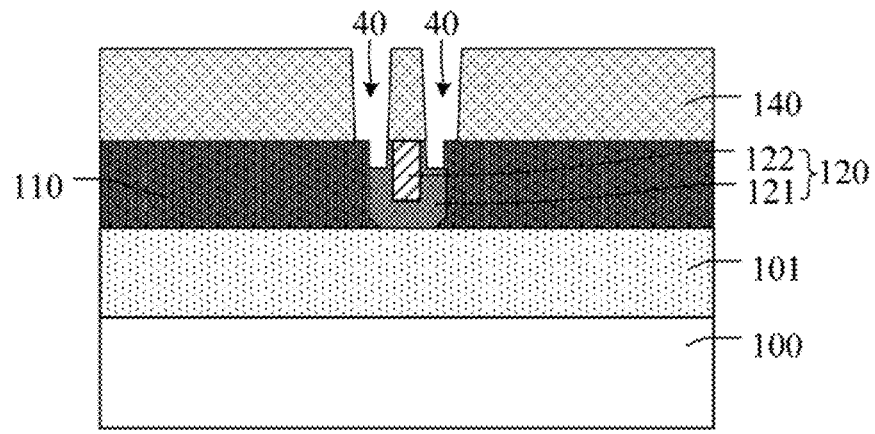

Referring to FIG. 18, the top dielectric layer 140 located above a junction of the blocking structure 120 and the conductive function layer 110 and a part of the blocking structure 120 located at the side wall of the conductive function layer 110 are etched, to form a via 40 running through the top dielectric layer 140 and exposing the part of the top and the part of the side wall of the conductive function layer 110.

The via 40 is configured to provide space for forming the via interconnection structure.

In some implementations, the top dielectric layer 140 located above the junction of the blocking structure 120 and the conductive function layer 110 is etched. Therefore, the subsequently formed via interconnection structure can be partially located on the end portion of the conductive function layer 110 close to the blocking structure 120, helping to improve the degree of freedom of the layout design of the via interconnection structure.

Moreover, In some implementations, the part of the blocking structure 120 located at the side wall of the conductive function layer 110 is further etched, to make the via 40 further expose the part of the side wall of the conductive function layer 110, so that in the subsequent process of forming a via interconnection structure, the via interconnection structure is not only in contact with the part of the top of the conductive function layer 110, but also in contact with the part of the side wall of the conductive function layer 110. That is, the via interconnection structure covers a top corner of the conductive function layer 110 adjacent to the blocking structure 120, which is helpful to increase a contact area between the via interconnection structure and the conductive function layer 110, so as to help to reduce the contact resistance between the via interconnection structure and the conductive function layer 110, to further help to improve the performance of the semiconductor structure.

In some implementations, in the process of forming the via 40, the etch stop layer 122 may be configured to define an etch stop position, thereby reducing a probability of mistakenly etching the etch stop layer 122 by using the etching process of forming the via 40, and accordingly reducing a probability that the via 40 located on one side of the blocking structure 120 exposes the conductive function layer 110 located on the other side of the blocking structure 120. In this way, a short circuit problem between the via interconnection structure and the adjacent conductive function layer is prevented, which not only helps to enlarge a process window of forming the via 40, but also helps to improve the reliability of the semiconductor structure.

In some implementations, in the step of forming a via 40, a part of the via 40 that is located between the conductive function layer 110 and the blocking structure 120 is used as a sub-via.

An opening width of the sub-via in the first direction should not be too small or too large. If the opening width of the sub-via is too small, in the subsequent step of forming the via interconnection structure filling the via 40, the difficulty in filling the via interconnection structure in the sub-via is relatively large; and if the opening width of the sub-via is too large, this easily causes that the remaining width of the blocking structure 120 that is located at a side wall of the sub-via is too small, which easily increases a risk of short circuit or breakdown between the via interconnection structure and the adjacent conductive function layer 110. Therefore, in some implementations, the opening width of the sub-via in the first direction is 5 nm to 50 nm.

A depth of the sub-via should not be too small or too large. If the depth of the sub-via is too small, an area of the side wall of the conductive function layer 110 exposed by the via 40 is too small accordingly, which easily leads to an inconspicuous effect of increasing the contact area between the via interconnection structure and the conductive function layer 110; and if the depth of the sub-via is too large, this easily causes that a volume of the blocking structure 120 that is located at the side wall of the sub-via is too small, which easily increases the risk of a short circuit or breakdown problem between the via interconnection structure and the adjacent conductive function layer 110. Therefore, in some implementations, the depth of the sub-via is 2 nm to 50 nm.

In some implementations, the step of forming a via 40 includes: etching the top dielectric layer 140 located above the junction of the blocking structure 120 and the conductive function layer 110, to form an initial via (not marked) running through the top dielectric layer 140, a bottom of the initial via exposing a part of the conductive function layer 110 and a part of the blocking structure 120; and etching the blocking structure 120 at the bottom of the initial via to expose a part of a side wall of the conductive function layer 110 that is adjacent to the blocking structure 120, to form the via 40.

In some implementations, the top dielectric layer 140 located above the junction of the blocking structure 120 and the conductive function layer 110 is etched using the anisotropic dry etching process, to form the initial via.

After the initial via is formed, one or two of the wet etching process and the dry etching process is adopted to etch the blocking structure 120 at the bottom of the initial via.

In some implementations, in the step of forming a via, a part of the pad layer 121 located on the side wall of the conductive function layer 110 is etched. The pad layer 121 and the etch stop layer 122 are made of different materials. By etching the part of the pad layer 121 located on the side wall of the conductive function layer 110, it is helpful to reduce the probability of mistakenly etching the etch stop layer 122, so that the etch stop layer 122 can define an etch stop position. Accordingly, it is helpful to prevent the blocking structure from being etched through by the etching process to expose the adjacent conductive function layer 110, and further helpful to improve the reliability of the process and reduce the risks of the process.

In some implementations, the part of the pad layer 121 located on the side wall of the conductive function layer 110 is etched, and an etching selection ratio of the pad layer 121 to the etch stop layer 122 in the etching process is at least 3:1. The etching process has a relatively large etching selection ratio of the pad layer 121 to the etch stop layer 122, which helps to further reduce the probability of mistakenly etching the etch stop layer 122, thereby ensuring that the etch stop layer 122 can define the etch stop position.

Figure 19:
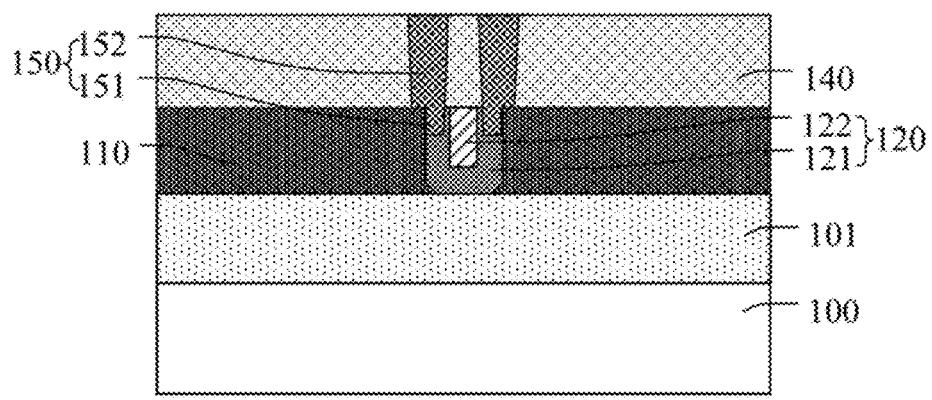

Referring to FIG. 19, the via interconnection structure 150 is filled in the via, and the via interconnection structure 150 is in contact with the part of the top and the part of the side wall of the conductive function layer 110.

The via interconnection structure 150 is configured to implement electrical connection between the conductive function layer 110 and other interconnection structures or an external circuit. Specifically, In some implementations, the via interconnection structure 150 is configured to implement the electrical connection between the interconnection line 110 and other interconnect structures or an external circuit.

In some implementations, in the process of forming the via interconnection structure 150, the via interconnection structure 150 is not only in contact with the part of the top of the conductive function layer 110, but also in contact with the part of the side wall of the conductive function layer 110. That is, the via interconnection structure 150 covers a top corner of the conductive function layer 110 adjacent to the blocking structure 120, which is helpful to increase a contact area between the via interconnection structure 150 and the conductive function layer 110, so as to help to reduce the contact resistance between the via interconnection structure 150 and the conductive function layer 110, to further help to improve the performance of the semiconductor structure.

In some implementations, the via interconnection structure 150 includes: a first part 151, located in a part of a width of the blocking structure 120 at the side wall of the conductive function layer 110 and in contact with the part of the side wall of the conductive function layer 110, and a second part 152 connected to the first part 151 and located on the first part 151, the second part 152 running through the top dielectric layer 140 located above the junction of the blocking structure 120 and the conductive function layer 110 and being in contact with the part of the top of the conductive function layer 110.

In some implementations, the first part 151 is located in the pad layer 121 on the side wall of the conductive function layer 110.

As can be learned from the above, by forming the etch stop layer 122, the probability that the via 40 exposes the adjacent conductive function layer 110 or the via 40 is too close to the adjacent conductive function layer 110 is reduced. Therefore, the probability of the short circuit or breakdown problem between the via interconnection structure 150 and the adjacent conductive function layer 110 is low, helping to ensure the reliability and stability of the semiconductor structure while improving the degree of freedom of the layout design of the via interconnection structure 150.

In some implementations, a material of the via interconnection structure 150 is copper, which is helpful to reduce signal delay of RC in the BEOL, improve a processing speed of a chip, and reduce power consumption. In other implementations, the material of the via interconnection structure may alternatively be a conductive material such as aluminum, tungsten, or cobalt.

In some implementations, the step of forming a via interconnection structure 150 includes: forming a conductive material layer (not shown in the figure) filled in the via 40, the conductive material layer further covering the top dielectric layer 140; and flattening the conductive material layer by using a top surface of the top dielectric layer 140 as a stop position, the remaining conductive material layer being used as the via interconnection structure 150.

A process of forming the conductive material layer includes one or more of the atomic layer deposition process, the physical vapor deposition process, the chemical vapor deposition process, and the electrochemical plating process.

In some implementations, the conductive material layer is flattened using a chemically-mechanically polishing (CMP) process, which is helpful to improve the flatness of a top surface of the via interconnection structure 150.

FIG. 20 to FIG. 23 are schematic structural diagrams corresponding to steps in another form of a forming method of a semiconductor structure according to the present disclosure. Similarities between the present form and the foregoing forms are not described herein again. Differences between the present form and the foregoing form are that: the conductive function layer is a metal gate, and the bottom dielectric layer is an interlayer dielectric layer.

Figure 20:
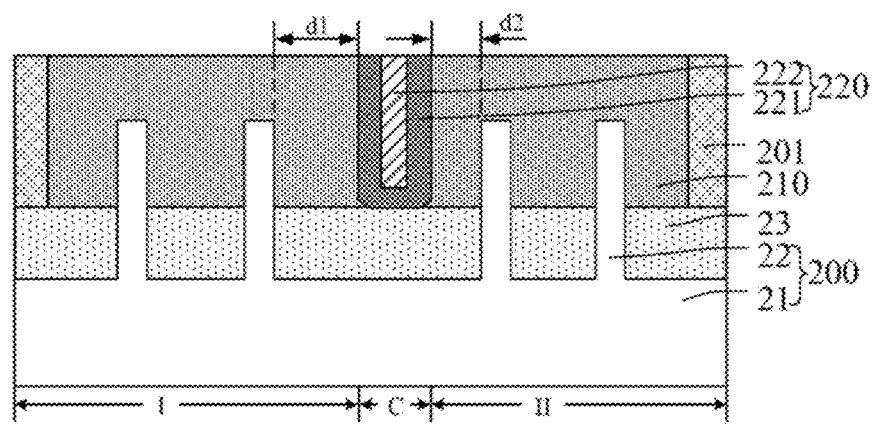
FIG. 20 to FIG. 23 are schematic structural diagrams corresponding to steps in another form of a forming method of a semiconductor structure according to the present disclosure.

Referring to FIG. 20, a base 200 is provided.

In some implementations, the base 200 includes a substrate 21 and a plurality of fins 22 discretely located on the substrate 21. The fins 22 extend in the second direction, and the base 200 includes a gate partition C, and a first device unit region I and a second device unit region II respectively located on two sides of the gate partition C.

In some implementations, the substrate 21 is a silicon substrate. In other implementations, the material of the substrate may alternatively be another material such as Ge, SiGe, SiC, GaAs, or InGa. The substrate can also be a substrate of another type, such as a Si substrate on an insulator or a Ge substrate on an insulator.

In some implementations, the fin 22 is made of a same material as that of the substrate 21, and the fin 22 is made of silicon.

The base 200 includes the first device unit region I and the second device unit region II that are adjacent to each other. A junction of the first device unit region I and the second device unit region II is the gate partition C configured to define a segmentation position of gates, so that gates of different device unit regions can be separated subsequently.

An isolation layer 23 is further formed on the substrate 21, the isolation layer 23 covers a part of a side wall of the fin 22, and a top surface of the isolation layer 23 is lower than a top surface of the fin 22. The isolation layer 23 is configured to play an isolation role between adjacent devices. In some implementations, a material of the isolation layer 23 is silicon oxide.

Still referring to FIG. 20, a plurality of conductive function layers 210 extending in the first direction and sequentially arranged in the second direction, a bottom dielectric layer 201 located on the base 200 between the conductive function layers 210, and a blocking structure 220 located in the conductive function layer 210 are formed on the base 200. The blocking structure 220 segments the conductive function layers 210 located on two sides of the blocking structure 220 in the first direction.

In some implementations, the conductive function layer 210 is a metal gate 210.

When the device is in operation, the metal gate 210 is configured to control on or off of a conductive channel. In some implementations, the metal gate 210 spans the plurality of fins 22 and covers a part of a top and the part of the side wall of the fin 22.

In some implementations, the metal gate 210 is formed on the isolation layer 23.

The metal gate 210 includes a high-k gate dielectric layer (not shown in the figure), a work function layer (not shown in the figure) located on the high-k gate dielectric layer, and a gate electrode layer (not shown in the figure) located on the work function layer.

In some implementations, the bottom dielectric layer 201 is an interlayer dielectric (ILD) layer, configured to implement isolation between adjacent metal gates 210.

In some implementations, the bottom dielectric layer 201 is formed on the isolation layer 23 between the metal gates 210. A material of the bottom dielectric layer 201 is an insulating material.

In some implementations, the blocking structure 220 is formed on the gate partition C. The blocking structure 220 is configured to segment a metal gate 210 of the first device unit region I and a metal gate 210 of the second device unit region II.

Specifically, the blocking structure 220 is formed on the isolation layer 23 of the gate partition C.

In some implementations, the blocking structure 220 includes an etch stop layer 222 and a pad layer 221 located between the etch stop layer 222 and a side wall of the metal gate 210. In some implementations, the pad layer 221 is further formed on a bottom of the etch stop layer 222. For the related description of the blocking structure 220, the etch stop layer 222, and the pad layer 221, reference may be made to the corresponding description in the foregoing implementations, as details are not described again in the present implementations.

In some implementations, in the first direction, there is a first distance d1 between the blocking structure 220 and a fin 22 that is in the first device unit region I and closest to the blocking structure 220, and there is a second distance d2 between the blocking structure 220 and a fin 22 that is in the second device unit region II and closest to the blocking structure 220, where the second distance d2 is smaller than the first distance d1. That is, compared with the distance between the fin 22 that is in the first device unit region I and closest to the blocking structure 220 and the blocking structure 220, the distance between the fin 22 that is in the second device unit region II and closest to the blocking structure 220 and the blocking structure 220 is smaller, and the distance between the side wall of the metal gate 210 of the second device unit region II and the fin 22 that is closest to the blocking structure 220 is smaller. The step of forming a metal gate 210 includes a process of filling a gate opening exposed by the blocking structure 220 with the metal gate 210. Because the distance between the fin 220 that is in the second device unit region II and closest to the blocking structure 220 and the blocking structure 220 is smaller, this easily causes that, in the process of forming the metal gate 210, the filling capability of the metal gate 210 in a gap between the blocking structure 220 and the fin 22 that is in the second device unit region II and closest to the blocking structure 220 is relatively poor, and the filling quality or the filling volume of the metal gate 210 in the gap between the blocking structure 220 and the fin 22 that is in the second device unit region II and closest to the blocking structure 220 is relatively poor or few, causing a turn-on voltage of a device formed by the fin 22 that is in the second device unit region II and closest to the blocking structure 220 and the metal gate 210 to be different from a turn-on voltage of a device formed by the fin 22 that is in the first device unit region I and closest to the blocking structure 220 and the metal gate 210. For example, the turn-on voltage of the device formed by the fin 22 that is in the second device unit region II and closest to the blocking structure 220 and the metal gate 210 is higher, causing a turn-on voltage of the fin 22 that is in the second device unit region II and closest to the blocking structure 220 to deviate.

Figure 21:
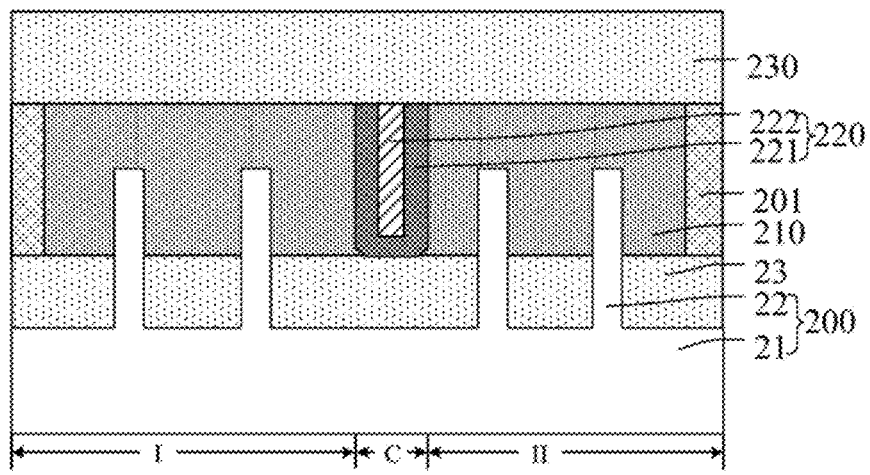

Referring to FIG. 21, the top dielectric layer 230 covering the bottom dielectric layer 201, the conductive function layer 210, and the blocking structure 220 is formed. The top dielectric layer 230 is configured to implement the electrical isolation between the via interconnection structures.

For the related description of the top dielectric layer 230, reference may be made to the corresponding description in the foregoing implementations, as details are not described again in the present implementations.

Figure 22:
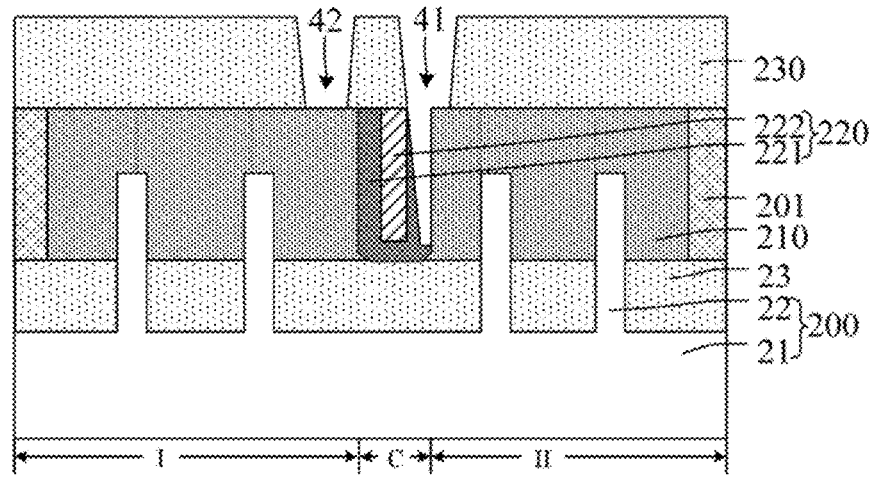

Referring to FIG. 22, the top dielectric layer 230 located above a junction of the blocking structure 220 and the conductive function layer 210 and a part of the blocking structure 220 located at the side wall of the conductive function layer 210 are etched, to form a via 41 running through the top dielectric layer 230 and exposing a part of a top and a part of a side wall of the conductive function layer 210.

In some implementations, in the step of forming a via 41, the top dielectric layer 230 located above the junction of the gate partition C and the second device unit region II and the part of the blocking structure 220 located at the side wall of the metal gate 210 of the second device unit region II are etched, to form the via 41 exposing a part of a top and a part of a side wall of the metal gate 210 of the second device unit region II.

In the step of forming a via 41, the forming method of a semiconductor structure further includes: etching the top dielectric layer 230 that is in the first device unit region I and close to the blocking structure 220, to form a contact hole 42, the contact hole 42 being encircled by a top surface of the metal gate 210 in the first device unit region I and the top dielectric layer 230.

In some implementations, in the first direction, the second distance d2 (as shown in FIG. 20) is smaller than the first distance d1 (as shown in FIG. 20). A turn-on voltage of a device corresponding to the fin 22 that is in the second device unit region II and closest to the blocking structure 220 is difference from a turn-on voltage of a device corresponding to the fin 22 that is in the first device unit region I and closest to the blocking structure 220, and the turn-on voltage of the device corresponding to the fin 22 that is in the second device unit region II and closest to the blocking structure 220 deviates.

In some implementations, by making the via 41 to expose the part of the top and the part of the side wall of the metal gate 210 of the second device unit region II, after the via interconnection structure is formed in the via 41 subsequently, in addition to being in contact with the part of the top of the metal gate 210 of the second device unit region II, the via interconnection structure can be further in contact with the part of the side wall of the metal gate 210 of the second device unit region II, which is helpful to increase a contact area between the via interconnection structure and the metal gate 210 of the second device unit region II. Moreover, In some implementations, an area of the top and the side wall of the metal gate 210 exposed by the via 41 may be larger than an area of the top of the metal gate 210 exposed by the contact hole 42 by adjusting an etching depth of the via 41, so that the contact area between the via interconnection structure and the metal gate 210 of the second device unit region II is larger. The material of the via interconnection structure is generally a metal material, and the metal material has a work function. By making the contact area between the via interconnection structure and the metal gate 210 of the second device unit region II larger, the via interconnection structure is enabled to play a role of adjusting the work function of the fin 22 that is in the second device unit region II and closest to the blocking structure 220.

For specific process steps of forming the via 41 in some implementations, reference may be made to the corresponding description in the foregoing implementations, as details are not described again in the present implementations.

Figure 23:
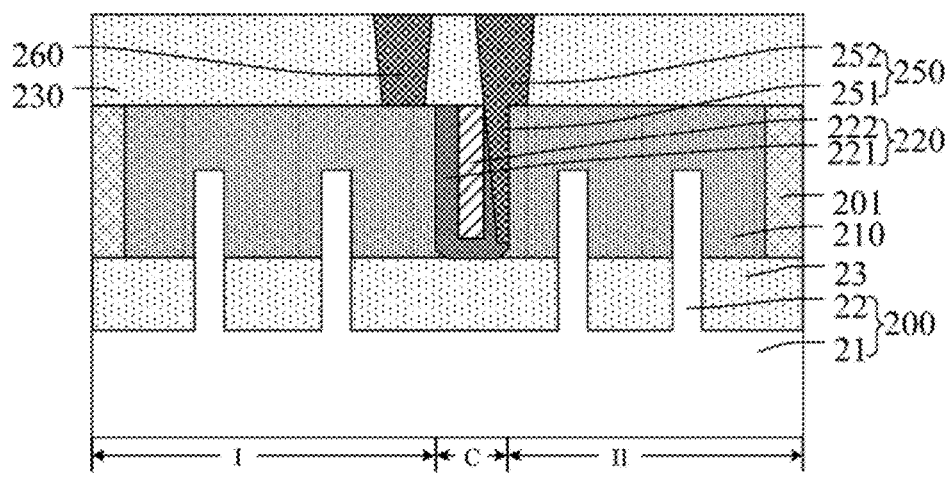

Referring to FIG. 23, the via interconnection structure 250 is filled in the via 41, and the via interconnection structure 250 is in contact with a part of a top and a part of a side wall of the conductive function layer 210.

In some implementations, the via interconnection structure 250 includes: a first part 251, located a part of a width of in the blocking structure 220 at the side wall of the conductive function layer 210 and in contact with the part of the side wall of the conductive function layer 210, and a second part 252 connected to the first part 251 and located on the first part 251, the second part 152 running through the top dielectric layer 230 located above the junction of the blocking structure 220 and the conductive function layer 210 and being in contact with the part of the top of the conductive function layer 210.

In some implementations, in the step of forming a via interconnection structure 250, the forming method of a semiconductor structure further includes: filling the contact hole 42 with a contact hole plug 260, a bottom of the contact hole plug 260 being in contact with the top surface of the metal gate 210 of the first device unit region I.

In some implementations, in the step of forming a via interconnection structure 250, the via interconnection structure 250 is in contact with the part of the side wall and a part of a top surface of the metal gate 210 of the second device unit region II, and the via interconnection structure 250 is configured to adjust the work function of the metal gate 210 of the second device unit region II.

In some implementations, in the first direction, the second distance d2 (as shown in FIG. 20) is smaller than the first distance d1 (as shown in FIG. 20). A turn-on voltage of a device corresponding to the fin 22 that is in the second device unit region II and closest to the blocking structure 220 is difference from a turn-on voltage of a device corresponding to the fin 22 that is in the first device unit region I and closest to the blocking structure 220, and the turn-on voltage of the device corresponding to the fin 22 that is in the second device unit region II and closest to the blocking structure 220 deviates.

In some implementations, in addition to being in contact with the part of the top of the metal gate 210 of the second device unit region II, the via interconnection structure 250 can be further in contact with the part of the side wall of the metal gate 210 of the second device unit region II, which is helpful to increase a contact area between the via interconnection structure 250 and the metal gate 210 of the second device unit region II. Moreover, in some implementations, an area of the top and the side wall of the metal gate 210 exposed by the via 41 may be larger than an area of the top of the metal gate 210 exposed by the contact hole 42 by adjusting an etching depth of the via 41, so that the contact area between the via interconnection structure 250 and the metal gate 210 of the second device unit region II is larger than a contact area between the contact hole plug 260 and the metal gate 210 of the first device unit region I. The material of the via interconnection structure 250 is generally a metal material, and the metal material has a work function. By making the contact area between the via interconnection structure 250 and the metal gate 210 of the second device unit region II larger, the via interconnection structure 250 is enabled to play a role of adjusting the work function of the fin 22 that is in the second device unit region II and closest to the blocking structure 220.

Therefore, in some implementations, the material of the via interconnection structure 250 is a metal work function material, and the material of the via interconnection structure 250 includes at least one of Cu, TaN, Ta, Ti, TiN, Co, Ru, RuN, W, or Al.

In some implementations, a material of the contact hole plug 260 is the same as the material of the via interconnection structure 250.

For specific process steps of forming the via interconnection structure 250 in some implementations, reference may be made to the corresponding description in the foregoing implementations, as details are not described again in the present implementations.

For detailed descriptions of the forming method of a semiconductor structure in some implementations, reference may be made to the corresponding descriptions in the foregoing implementations, as details are not described again in the present implementations.

Accordingly, the present disclosure further provides a semiconductor structure. FIG. 19 is a schematic structural diagram of one form of a semiconductor structure according to the present disclosure. Specifically, FIG. 19 is a cross-sectional view in an extending direction of a conductive function layer.

The semiconductor structure includes: a base 100; a plurality of conductive function layers extending in a first direction and sequentially arranged in a second direction that are located on the base 100; a bottom dielectric layer 101, located on the base 100 between the conductive function layers 110; a blocking structure 120 located in the conductive function layer 110, the blocking structure 120 segmenting the conductive function layers 110 located on two sides of the blocking structure 120 in the first direction; a top dielectric layer 140, covering the bottom dielectric layer 101, the conductive function layers 110, and the blocking structure 120; a via interconnection structure 150, including a first part 151 located in a part of a width of the blocking structure 120 at a side wall of the conductive function layer 110 and being in contact with a part of a side wall of the conductive function layer 110, and a second part 152 connected to the first part 151 and located on the first part 151, the second part 152 running through the top dielectric layer 140 located above a junction of the blocking structure 120 and the conductive function layer 110 and being in contact with a part of a top of the conductive function layer 110.

The via interconnection structure 150 includes a first part 151 located in a part of a width of the blocking structure 120 at the side wall of the conductive function layer 110 and being in contact with the part of the side wall of the conductive function layer 110, and a second part 152 connected to the first part 151 and located on the first part 151, the second part 152 running through the top dielectric layer 140 located above a junction of the blocking structure 120 and the conductive function layer 110 and being in contact with the part of the top of the conductive function layer 110. That is, the via interconnection structure 150 is not only in contact with the part of the top of the conductive function layer 110, but also in contact with the part of the side wall of the conductive function layer 110. That is, the via interconnection structure 150 covers a top corner of the conductive function layer 110 adjacent to the blocking structure 120, which is helpful to increase a contact area between the via interconnection structure 150 and the conductive function layer 110, so as to help to reduce the contact resistance between the via interconnection structure 150 and the conductive function layer 110, to further help to improve the performance of the semiconductor structure.

The base 100 provides a process platform for processes. Semiconductor devices such as a transistor and a capacitor may be formed in the base 100, and functional structures such as a resistance structure and a conductive structure may also be formed in the base 100.

The bottom dielectric layer 101 is configured to implement the electrical isolation between the conductive function layers 110.

In some implementations, the bottom dielectric layer 101 is an IMD layer and is configured to electrically isolate adjacent interconnection structures in a BEOL process. As an example, the bottom dielectric layer 101 is a single-layer structure, and a material of the bottom dielectric layer 101 is an ultra-low-k dielectric material.

Accordingly, in some implementations, the conductive function layer 110 is an interconnection line 110, and the bottom dielectric layer 101 is configured to implement the electrical isolation between adjacent interconnection lines 110. The interconnection line 110 is configured to implement the electrical connection between the base 100 and an external circuit or other interconnection structures.

As an example, the conductive function layer 110 is a single-layer structure, and a material of the conductive function layer 110 is copper.

The blocking structure 120 is configured to segment the conductive function layers 110 in the first direction, so as to disconnect the conductive function layers 110 at a position where interconnection is not required, so that a pattern and the performance of electrical connection of the conductive function layers 110 meet a design requirement. In some implementations, the second direction is perpendicular to the first direction.

In some implementations, the blocking structure 120 includes an etch stop layer 122 and a pad layer 121 located between the etch stop layer 122 and the side wall of the conductive function layer 110, and the pad layer 121 further covers a bottom of the etch stop layer 122. Accordingly, the first part 151 is located in the pad layer 121 on the side wall of the conductive function layer 110.

The step of forming a via interconnection structure 150 includes: etching the top dielectric layer 140 located above a junction of the blocking structure 120 and the conductive function layer 110 and a part of the blocking structure 120 located at the side wall of the conductive function layer 110, to form a via running through the top dielectric layer 140 and exposing the part of the top and the part of the side wall of the conductive function layer 110; and filling the via with the via interconnection structure 150.

The blocking structure 120 includes the etch stop layer 122 and the pad layer 121, so that in a process of forming a via, the pad layer 121 located on the side wall of the conductive function layer 110 may be etched. The etch stop layer 122 may define an etch stop position in the process of forming a via. A process of etching the top dielectric layer 140 has a relatively high etching selection ratio of the top dielectric layer 140 to the etch stop layer 122, a process of etching the pad layer 121 has a relatively high etching selection ratio of the pad layer 121 to the etch stop layer 122, and a process of etching the top dielectric layer 140 and the pad layer 121 has a low probability of mistakenly etching the etch stop layer 122, which is helpful to reduce a probability that a via located on one side of the blocking structure 120 exposes the conductive function layer 110 located on the other side of the blocking structure 120. Accordingly, a probability that there is a short circuit or breakdown problem between the via interconnection structure 150 and the adjacent conductive function layer 110 is relatively low, so that the via interconnection structure 150 can be partially landed on an end portion of the conductive function layer 110 close to the blocking structure 120, to further help to improve a degree of freedom of a layout design of forming the via interconnection structure 150 and improve the reliability and stability of the semiconductor structure.

A material of the pad layer 121 includes at least one of silicon oxide, silicon nitride, aluminum oxide, titanium oxide, nitrogen doped silicon carbide, carbon doped silicon oxide, or silicon carbide. The material of the pad layer 121 is a dielectric material, which is helpful to reduce the impact on the performance of the semiconductor structure, and also ensures that the blocking structure 120 can electrically isolate the conductive function layers 110 located on two sides of the blocking structure 120 in the first direction.

In some implementations, the material of the pad layer 121 is silicon oxide.

A material of the etch stop layer 122 includes at least one of silicon oxide, silicon nitride, aluminum oxide, titanium oxide, nitrogen doped silicon carbide, carbon doped silicon oxide, or silicon carbide. The material of the etch stop layer 122 is different from the material of the pad layer 121. In some implementations, the material of the etch stop layer 122 is aluminum oxide. In a subsequent etching process of forming a via, the etching process has a relatively large etching selection ratio of the material of the top dielectric layer to aluminum oxide and a relatively large etching selection ratio of silicon oxide to aluminum oxide, so as to ensure that the etch stop layer 122 can play a role of defining the etch stop position.

In some implementations, a case that the blocking structure 120 includes the etch stop layer 122 and the pad layer 121 located between the etch stop layer 122 and the side wall of the conductive function layer 110, and the pad layer 121 is further formed on a bottom of the etch stop layer 122 is used as an example.

In other implementations, the blocking structure may alternatively include the etch stop layer and the pad layer located between the etch stop layer and the side wall of the conductive function layer. In some implementations, the pad layer is only located between the etch stop layer and the side wall of the conductive function layer. That is, the thickness of the etch stop layer is larger, which is helpful to improve the effect of the etch stop layer configured to define the etch stop position of the etching process of forming a via and helpful to further enlarge the process window of forming a via interconnection structure accordingly.

The top dielectric layer 140 is configured to implement the electrical isolation between the via interconnection structures 150.

In some implementations, the top dielectric layer 140 is also an IMD layer.

The via interconnection structure 150 is configured to implement electrical connection between the interconnection line 110 and other interconnection structures or an external circuit. In some implementations, a material of the via interconnection structure 150 is copper.

In some implementations, in the first direction, a width of the first part 151 is 5 nm to 50 nm.

In some implementations, a height of the first part 151 is 2 nm to 50 nm.

The semiconductor structure may be formed using the forming method in the foregoing implementations, or may be formed using other forming methods. For specific descriptions for the semiconductor structure of the present implementations, reference may be made to corresponding descriptions in the foregoing implementations. Details are not described again in the present implementations.

FIG. 23 is a schematic structural diagram of another form of a semiconductor structure according to the present disclosure. Similarities between the present implementations and the foregoing implementations are not described herein again.

Differences between the present implementations and the foregoing implementations are that: the base 200 includes a substrate 21 and a plurality of fins 22 discretely located on the substrate 21, where the fins 22 extend in the second direction, that the base 200 includes a gate partition C, and that a first device unit region I and a second device unit region II are respectively located on two sides of the gate partition C.

In some implementations, the substrate 21 is a silicon substrate; and a material of the fin 22 is silicon.

An isolation layer 23 covering a part of a side wall of the fin 22 is further formed on the substrate 21, and a top surface of the isolation layer 23 is lower than a top surface of the fin 22. The isolation layer 23 is configured to play an isolation role between adjacent devices. In some implementations, a material of the isolation layer 23 is silicon oxide.

The base 200 includes the first device unit region I and the second device unit region II that are adjacent to each other. A junction of the first device unit region I and the second device unit region II is the gate partition C configured to define a segmentation position of gates 210, so that metal gates 210 of different device unit regions can be separated.

The conductive function layer 210 is a metal gate 210, and the bottom dielectric layer 201 is an interlayer dielectric layer 201.

When the device is in operation, the metal gate 210 is configured to control on or off of a conductive channel.

The metal gate 210 spans the plurality of fins 22 and covers a part of a top and the part of the side wall of the fin 22.

The metal gate 210 includes a high-k gate dielectric layer (not shown in the figure), a work function layer (not shown in the figure) located on the high-k gate dielectric layer, and a gate electrode layer (not shown in the figure) located on the work function layer.

In some implementations, the metal gate 210 is formed on the isolation layer 23.

In some implementations, the bottom dielectric layer 201 is an interlayer dielectric (ILD) layer, configured to implement isolation between adjacent metal gates 210. In some implementations, a material of the bottom dielectric layer 201 is silicon oxide.

In some implementations, the blocking structure 220 is located on the gate partition C. The blocking structure 220 is configured to segment a metal gate 210 of the first device unit region I and a metal gate 210 of the second device unit region II.

Specifically, the blocking structure 220 is formed on the isolation layer 23 of the gate partition C.

In some implementations, the blocking structure 220 includes an etch stop layer 222 and a pad layer 221 located between the etch stop layer 222 and a side wall of the metal gate 210. In some implementations, the pad layer 221 further covers a bottom of the etch stop layer 222. For the related description of the blocking structure 220, the etch stop layer 222, and the pad layer 221, reference may be made to the corresponding description in the foregoing implementations, as details are not described again in the present implementations.

In some implementations, in the first direction, there is a first distance d1 (as shown in FIG. 20) between the blocking structure 220 and a fin 22 that is in the first device unit region I and closest to the blocking structure 220, and there is a second distance d2 (as shown in FIG. 20) between the blocking structure 220 and a fin 22 that is in the second device unit region II and closest to the blocking structure 220, where the second distance d2 is smaller than the first distance d1. That is, compared with the distance between the fin 22 that is in the first device unit region I and closest to the blocking structure 220 and the blocking structure 220, the distance between the fin 22 that is in the second device unit region II and closest to the blocking structure 220 and the blocking structure 220 is smaller, and the distance between the side wall of the metal gate 210 of the second device unit region II and the fin 22 that is closest to the blocking structure 220 is smaller. The step of forming a metal gate 210 includes a process of filling a gate opening exposed by the blocking structure 220 with the metal gate 210. Because the distance between the fin 220 that is in the second device unit region II and closest to the blocking structure 220 and the blocking structure 220 is smaller, this easily causes that, in the process of forming the metal gate 210, the filling capability of the metal gate 210 in a gap between the blocking structure 220 and the fin 22 that is in the second device unit region II and closest to the blocking structure 220 is relatively poor, and the filling quality or the filling volume of the metal gate 210 in the gap between the blocking structure 220 and the fin 22 that is in the second device unit region II and closest to the blocking structure 220 is relatively poor or few, causing a turn-on voltage of a device formed by the fin 22 that is in the second device unit region II and closest to the blocking structure 220 and the metal gate 210 to be different from a turn-on voltage of a device formed by the fin 22 that is in the first device unit region I and closest to the blocking structure 220 and the metal gate 210. For example, the turn-on voltage of the device formed by the fin 22 that is in the second device unit region II and closest to the blocking structure 220 and the metal gate 210 is higher, causing a turn-on voltage of the fin 22 that is in the second device unit region II and closest to the blocking structure 220 to deviate.

The top dielectric layer 230 is configured to implement the electrical isolation between the via interconnection structures. For the related description of the top dielectric layer 230, reference may be made to the corresponding description in the foregoing implementations, as details are not described again herein.

In some implementations, the via interconnection structure 250 includes: a first part 251, located in a part of a width of the blocking structure 220 at the side wall of the conductive function layer 210 and in contact with a part of a side wall of the conductive function layer 210, and a second part 252 connected to the first part 251 and located on the first part 251, the second part 152 running through the top dielectric layer 230 located above the junction of the blocking structure 220 and the conductive function layer 210 and being in contact with a part of a top of the conductive function layer 210.

The semiconductor structure further includes: a contact hole plug 260 running through the top dielectric layer 230 that is in the first device unit region I and close to the blocking structure 220, where a bottom of the contact hole plug 260 is in contact with the top surface of the metal gate 210 in the first device unit region I.

In some implementations, the via interconnection structure 250 is located in the top dielectric layer 230 located above the junction of the gate partition C and the second device unit region II and the part of the blocking structure 220 at the side wall of the metal gate 210 of the second device unit region II, and the via interconnection structure 250 is in contact with a part of a side wall and a part of a top surface of the metal gate 210 of the second device unit region II, where the via interconnection structure 250 is configured to adjust a work function of the metal gate 210 of the second device unit region II.

In some implementations, in the first direction, the second distance d2 is smaller than the first distance d1. A turn-on voltage of a device formed by the fin 22 that is in the second device unit region II and closest to the blocking structure 220 and the metal gate 210 is difference from a turn-on voltage of a device formed by the fin 22 that is in the first device unit region I and closest to the blocking structure 220 and the metal gate 210, and the turn-on voltage of the fin 22 that is in the second device unit region II and closest to the blocking structure 220 deviates.

In some implementations, in addition to being in contact with a part of a top of the metal gate 210 of the second device unit region II, the via interconnection structure 250 can be further in contact with the part of the side wall of the metal gate 210 of the second device unit region II, which is helpful to increase a contact area between the via interconnection structure 250 and the metal gate 210 of the second device unit region II. Moreover, in some implementations, an area of the top and the side wall of the metal gate 210 exposed by the via 41 may be larger than an area of the top of the metal gate 210 exposed by the contact hole 42 by adjusting an etching depth of the via 41, so that the contact area between the via interconnection structure 250 and the metal gate 210 of the second device unit region II is larger than a contact area between the contact hole plug 260 and the metal gate 210 of the first device unit region I. The material of the via interconnection structure 250 is generally a metal material, and the metal material has a work function. By making the contact area between the via interconnection structure and the metal gate 210 of the second device unit region II larger, the via interconnection structure is enabled to play a role of adjusting the work function of the fin 22 that is in the second device unit region II and closest to the blocking structure 220.

Therefore, the material of the via interconnection structure 250 is a metal work function material, and the material of the via interconnection structure 250 includes at least one of Cu, TaN, Ta, Ti, TiN, Co, Ru, RuN, W, or Al.

In some implementations, a material of the contact hole plug 260 is the same as the material of the via interconnection structure 250.

The semiconductor structure may be formed using the forming method in the foregoing implementations, or may be formed using other forming methods. For detailed descriptions of the semiconductor structure in some implementations, reference may be made to the corresponding descriptions in the foregoing implementations, as details are not described again in the present implementations.

Although the present disclosure is disclosed above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A forming method of a semiconductor structure, comprising:
    providing a base;
    forming a bottom dielectric layer on the base;
    forming a plurality of hard mask layers extending in a first direction and sequentially arranged in a second direction different from the first direction on the bottom dielectric layer;
    etching a part of the bottom dielectric layer located between adjacent hard mask layers in the second direction to form a blocking groove encircled by the adjacent hard mask layers and the bottom dielectric layer;
    forming a blocking structure filled in the blocking groove;
    forming, on the base, a plurality of conductive function layers extending in the first direction and sequentially arranged in the second direction different from the first direction, where the bottom dielectric layer is located between the conductive function layers, and the blocking structure is located in a conductive function layer, the blocking structure segmenting the conductive function layer located on two sides of the blocking structure in the first direction;
    etching a part of a thickness of the bottom dielectric layer using the hard mask layers and the blocking structure as masks, to form an interconnection trench in the bottom dielectric layer;
    forming a top dielectric layer covering the bottom dielectric layer, the conductive function layers, and the blocking structure;
    etching the top dielectric layer located above a junction of the blocking structure and the conductive function layer and a part of the blocking structure located at a side wall of the conductive function layer, to form a via running through the top dielectric layer and exposing a part of a top and a part of a side wall of the conductive function layer; and
    filling the via with a via interconnection structure, the via interconnection structure being in contact with the part of the top and the part of the side wall of the conductive function layer.

2. The forming method of a semiconductor structure according to claim 1, wherein:
    the conductive function layer is a gate, and the bottom dielectric layer is an interlayer dielectric layer; or
    the conductive function layer is an interconnection line, and the bottom dielectric layer is an inter metal dielectric layer.

3. The forming method of a semiconductor structure according to claim 1, wherein:
    the blocking structure comprises:
        an etch stop layer and a pad layer located between the etch stop layer and the side wall of the conductive function layer; or
        an etch stop layer and a pad layer located between the etch stop layer and the side wall of the conductive function layer, and the pad layer is further formed on a bottom of the etch stop layer; and
    in the step of forming the via, a part of the pad layer located at the side wall of the conductive function layer is etched.

4. The forming method of a semiconductor structure according to claim 3, wherein the part of the pad layer located at the side wall of the conductive function layer is etched using an etching process, and an etching selection ratio of the pad layer to the etch stop layer in the etching process is at least 3:1.

5. The forming method of a semiconductor structure according to claim 1, wherein:
    the step of forming the via comprises: etching the top dielectric layer located above the junction of the blocking structure and the conductive function layer, to form an initial via running through the top dielectric layer, where a bottom of the initial via exposes a part of the conductive function layer and a part of the blocking structure; and
    etching the blocking structure at the bottom of the initial via to expose a part of a side wall of the conductive function layer adjacent to the blocking structure, to form the via.

6. The formation method of a semiconductor structure according to claim 5, wherein at least one of a wet etching process or a dry etching process is adopted to etch the blocking structure at the bottom of the initial via.

7. The forming method of a semiconductor structure according to claim 1, wherein:
    the conductive function layer is a metal gate, and the bottom dielectric layer is an interlayer dielectric layer;
    in the step of proving a base, the base comprises a substrate and a plurality of fins discretely located on the substrate, where the fins extend in the second direction, and the base comprises a gate partition, and a first device unit region and a second device unit region located on two sides of the gate partition;
    the metal gate spans the plurality of fins and covers a part of a top and a part of a side wall of the fin;
    the blocking structure is formed on the gate partition, and in the first direction, there is a first distance between the blocking structure and a fin that is closest to the blocking structure and in the first device unit region, and there is a second distance between the blocking structure and a fin that is closest to the blocking structure and in the second device unit region, wherein the second distance is smaller than the first distance;
    in the step of forming the via, the top dielectric layer located above a junction of the gate partition and the second device unit region and a part of the blocking structure located at a side wall of the metal gate in the second device unit region are etched to form a via exposing a part of a top and a part of a side wall of the metal gate in the second device unit region;

in the step of forming the via, the forming method of a semiconductor structure further comprises: etching the top dielectric layer that is located in the first device unit region and close to the blocking structure, to form a contact hole, wherein the contact hole is encircled by a top surface of the metal gate in the first device unit region and the top dielectric layer;

in the step of forming the via interconnection structure, the via interconnection structure is in contact with the part of the side wall and the part of the top surface of the metal gate in the second device unit region, and the via interconnection structure is configured to adjust a work function of the metal gate in the second device unit region; and in the step of forming the via interconnection structure, the forming method of a semiconductor structure further comprises: filling the contact hole with a contact hole plug, where a bottom of the contact hole plug is in contact with the top surface of the metal gate in the first device unit region.

8. The forming method of a semiconductor structure according to claim 1, wherein:

the conductive function layer is an interconnection line, and the bottom dielectric layer is an inter metal dielectric layer; and the method further comprises:

forming the interconnection line in the interconnection trench; and removing the hard mask layer and the blocking structure that is higher than the bottom dielectric layer.

9. The forming method of a semiconductor structure according to claim 8, wherein:

the step of forming a blocking groove comprises:

forming a pattern layer covering the hard mask layer on the bottom dielectric layer, where a mask opening exposes a part of a top surface of the bottom dielectric layer and a part of a side wall of the hard mask layer between adjacent hard mask layers in the second direction being formed in the pattern layer; and etching the part of the thickness of the bottom dielectric layer that is exposed by the mask opening using the pattern layer as a mask to form the blocking groove;

the step of forming a blocking structure comprises:

forming a blocking film filling the blocking groove, the blocking film being further formed on a side wall of the mask opening and a top of the pattern layer; and removing the blocking film and the pattern layer that are higher than the hard mask layer, where a remaining blocking film located in the blocking groove is used as the blocking structure; and after forming the blocking structure and before forming the interconnection trench, the forming method of a semiconductor structure further comprises: removing the pattern layer, and exposing the bottom dielectric layer located between the hard mask layers.

10. The forming method of a semiconductor structure according to claim 9, wherein:

the blocking structure comprises an etch stop layer and a pad layer located between the etch stop layer and the side wall of the conductive function layer; and the step of forming a blocking structure comprises:

forming a pad film on a bottom and a side wall of the blocking groove, the side wall of the mask opening, and a top surface of the pattern layer;

forming an etch stop film located on the pad film and filled in the blocking groove, the etch stop film and the pad film configured to constitute the blocking film; and removing the etch stop film, the pad film, and the pattern layer that are higher than the hard mask layer, where a remaining etch stop film located in the blocking groove is used as the etch stop layer, and the remaining pad film located in the blocking groove being used as the pad layer.

11. The forming method of a semiconductor structure according to claim 10, wherein the step of forming a blocking structure further comprises: after forming the pad film and before forming the etch stop film, removing the pad film located on the bottom of the blocking groove and the top surface of the pattern layer.

12. The forming method of a semiconductor structure according to claim 11, wherein:

a process of forming the pad film comprises an atomic layer deposition process; and a process of forming the etch stop film comprises one or two of the atomic layer deposition process and a spin coating process.

* * * * *